United States Patent
Chien et al.

(10) Patent No.: US 9,473,719 B2
(45) Date of Patent: Oct. 18, 2016

(54) PROTECTION LAYER IN CMOS IMAGE SENSOR ARRAY REGION

(71) Applicant: Taiwan Semiconductor Manufacturing Company, Ltd., Hsin-Chu (TW)

(72) Inventors: Volume Chien, Tainan (TW); Yi-Sheng Liu, Yilan (TW); Chia-Yu Wei, Tainan (TW); Yun-Wei Cheng, Taipei (TW); Chi-Cherng Jeng, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 145 days.

(21) Appl. No.: 14/144,229

(22) Filed: Dec. 30, 2013

(65) Prior Publication Data
US 2015/0189207 A1 Jul. 2, 2015

(51) Int. Cl.
*H04N 5/374* (2011.01)
*H01L 31/0232* (2014.01)
*H04N 5/335* (2011.01)

(52) U.S. Cl.
CPC .......... *H04N 5/374* (2013.01); *H01L 31/0232* (2013.01); *H04N 5/335* (2013.01)

(58) Field of Classification Search
CPC ... H04N 5/374; H04N 5/335; H01L 31/0232
See application file for complete search history.

(56) References Cited

U.S. PATENT DOCUMENTS

| | | | | |
|---|---|---|---|---|
| 2005/0247941 A1* | 11/2005 | Adachi | ............ | H01L 27/14643 257/72 |
| 2007/0034869 A1* | 2/2007 | Saito | ................. | H01L 27/14683 257/53 |
| 2008/0029793 A1* | 2/2008 | Watanabe | ......... | H01L 27/14609 257/291 |
| 2009/0295979 A1* | 12/2009 | Matsuo | ............. | H01L 27/14636 348/335 |
| 2015/0147843 A1* | 5/2015 | Onuki | ............... | H01L 27/14643 438/59 |

* cited by examiner

*Primary Examiner* — Abdelaaziz Tissire
(74) *Attorney, Agent, or Firm* — Slater Matsil, LLP

(57) ABSTRACT

A semiconductor image sensor device having a conformal protective layer includes a semiconductor substrate a pixel-array region and a peripheral region. The conformal protective layer is disposed over a plurality of pixels having a photodiode and a plurality of transistors in the pixel-array region. Contacts to the plurality of transistors are surrounded by the conformal protective layer. In some embodiments, the conformal protective layer is the same material as transistor gate spacers in the peripheral region.

20 Claims, 12 Drawing Sheets

PROTECTION LAYER IN CMOS IMAGE SENSOR ARRAY REGION

FIELD

The present disclosure pertains to semiconductor materials and processes, particularly to materials and processes for CMOS image sensors.

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One type of IC device is an image sensor device that includes a pixel-array for detecting light and recording an intensity (brightness) of the detected light. The pixel-array responds to the light by accumulating a charge, for example the more light, the higher the charge. The accumulated charge is then used (for example, by other circuitry) to provide a color and brightness for use in a suitable application, such as a digital camera. One type of image sensor device is a complementary metal-oxide-semiconductor (CMOS) image sensor device. CMOS image sensor devices are used for sensing a volume of light projected toward a surface of a substrate (which supports the image sensor circuitry of the CMOS image sensor device). The pixel-array is located at a pixel-array region of the substrate, and other circuitry including logic processing and power is located at a peripheral region of the substrate. Due to device scaling, improvements to CMOS technology are continually being made to further improve image quality of image sensor devices. In one example, the transistors and image sensors in the pixel-array region are sensitive to substrate leakage current. Substrate leakage current can cause white pixels or dark current, which are undesirable. The substrate leakage current limit for the transistors in the peripheral region is higher than that for the pixel-array region as the pixel-array region transistors and photodiodes are more sensitive to substrate leakage current. Although existing CMOS image sensor devices and methods of fabricating CMOS image sensor devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Image sensor designs are improved to minimize substrate leakage current while maintaining good structural integrity and manufacturability. One common cause for increased substrate leakage current is plasma damage during etching, deposition, and/or implanting processes. Plasma is used in various operations of the CMOS manufacturing process. Many plasma operations may in combination, or sometimes singly, contribute to substrate leakage current. According to various embodiments of this disclosure, a protective layer is used over the photodiode and transistor features on a front side of the substrate in the pixel-array region to minimize plasma and implant damage to the substrate in the pixel-array region. The protective layer is deposited over the pixels, including photodiode and associated transistors, in a conformal layer separate from an intermetal dielectric (IMD) layer.

Figure 1A:
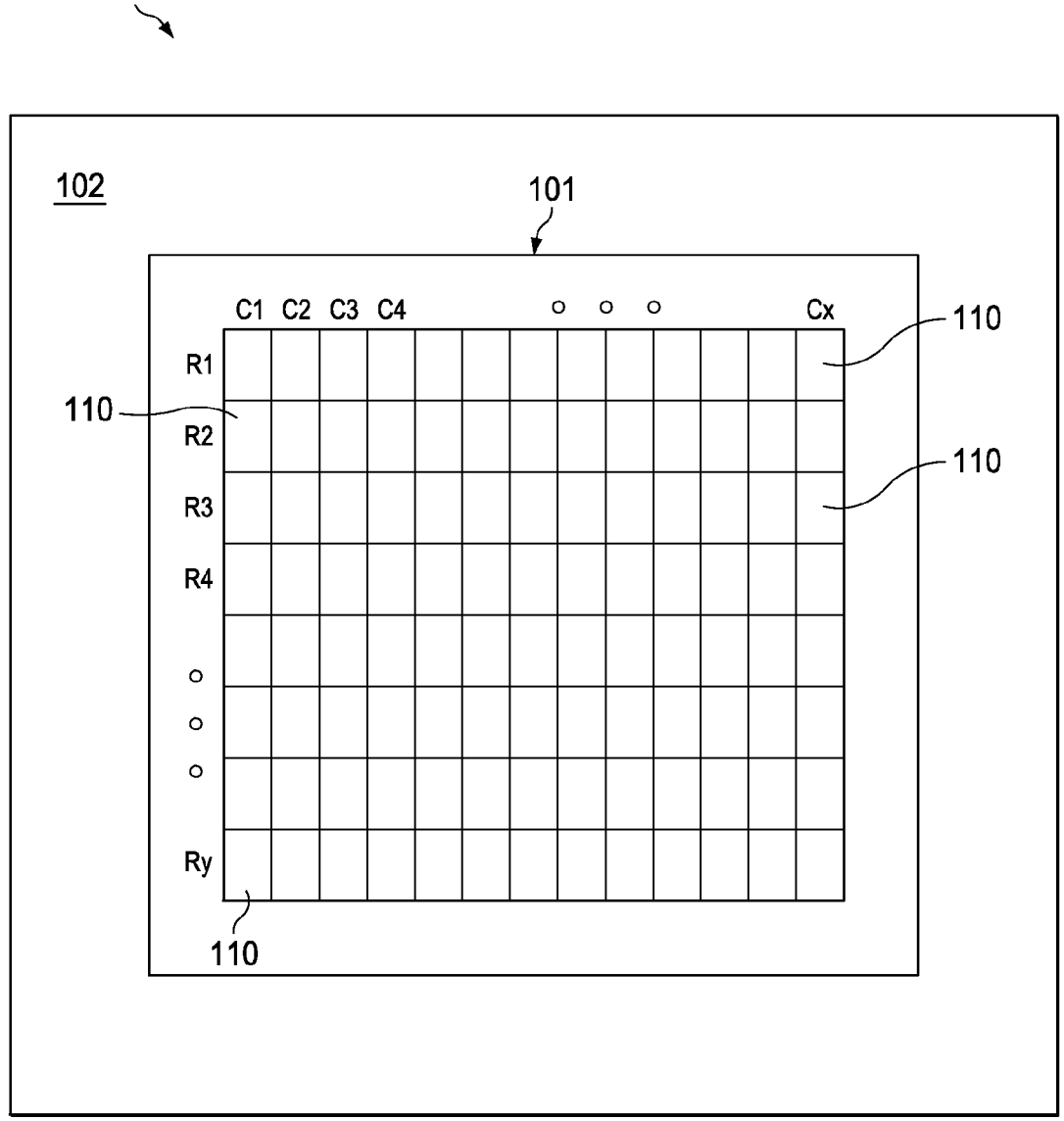
FIG. 1A is a top view of an image sensor device according to various aspects of the present disclosure.

A description of a CMOS image sensor (CIS) device is discussed in association with FIG. 1A. FIG. 1A is a top view of an image sensor device 100 according to various aspects of the present disclosure. The image sensor device 100 includes a pixel-array region 101 and a peripheral region 102. The pixel-array region 101 includes an array of pixels 110. Each pixel 110 is arranged into a column (for example, C1 to Cx) and a row (for example, R1 to Ry). The term "pixel" refers to a unit cell containing features (for example, a photodetector and various circuitry, which may include various semiconductor devices such as transistors) for converting electromagnetic radiation to an electrical signal. The pixels 110 may include photodiodes, complementary metal-oxide-semiconductor (CMOS) image sensors, charged coupling device (CCD) sensors, active sensors, passive sensors, other sensors, or future-developed image sensing devices. The pixels 110 may be designed having various sensor types. For example, one group of pixels 110 may be CMOS image sensors and another group of pixels 110 may be passive sensors. Moreover, the pixels 110 may include color image sensors and/or monochromatic image sensors. In an example, each pixel 110 is an active pixel sensor, such as a complementary metal-oxide-semiconductor (CMOS) image sensor. In the depicted embodiment, each pixel 110 may include a photodetector, such as a photogate-type photodetector, for recording an intensity or brightness of light (radiation). Each pixel 110 may also include various semiconductor devices, such as various transistors including a transfer transistor, a reset transistor, a source-follower transistor, a select transistor, other suitable transistor, or combinations thereof.

The peripheral region 102 includes additional circuitry such as input/output, logic processor, power, and the like that are coupled to the pixel-array in the pixel-array region 101 to provide an operation environment for the pixels 110 and support external communications with the pixels 110. For example, the peripheral region 102 includes readout circuitry and/or control circuitry. For simplicity, image sensor devices including a single pixel are described in the present disclosure; however, typically a large array of such pixels form the image sensor device 100 illustrated in FIG. 1A.

Figure 1B:
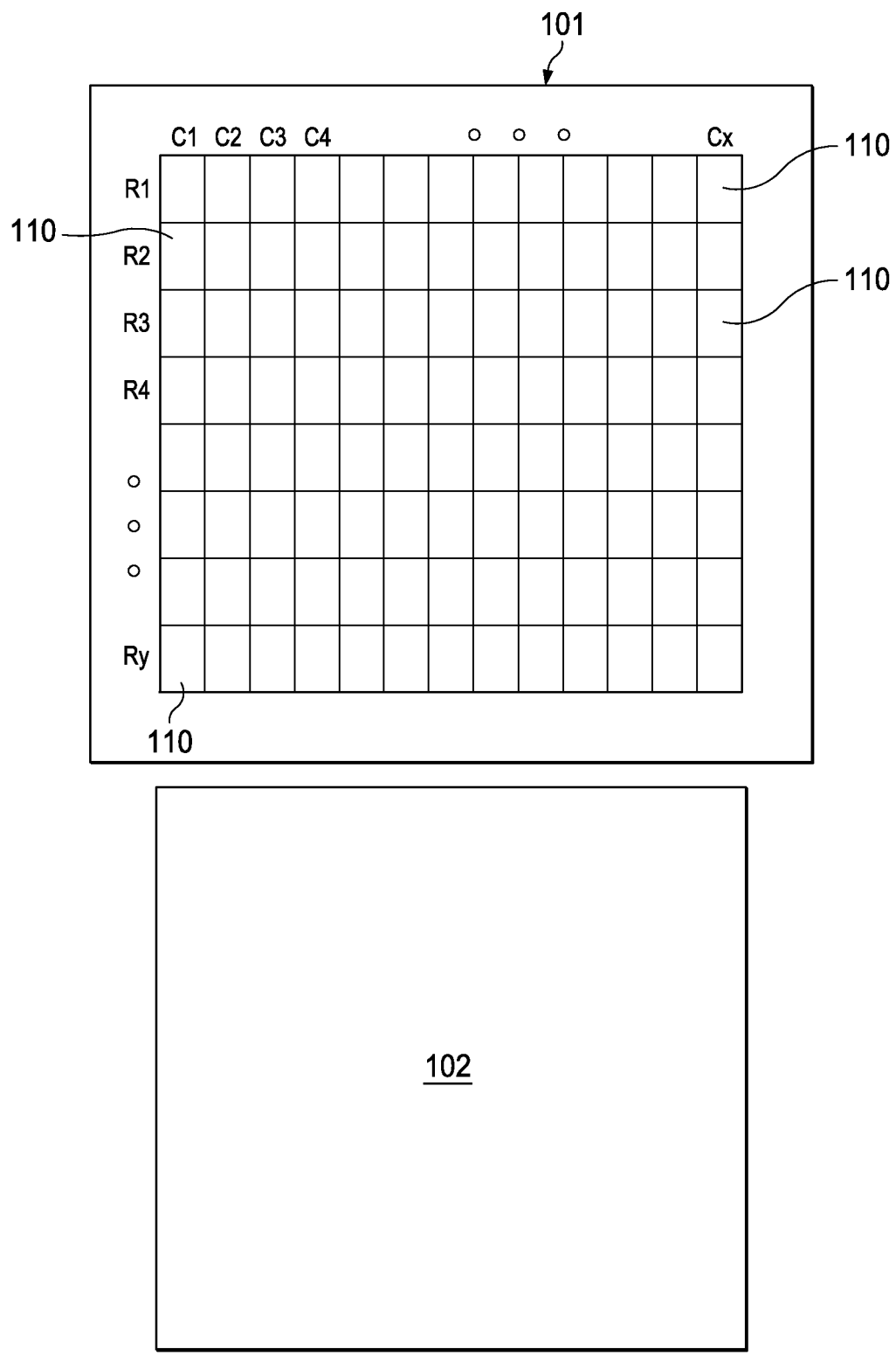
FIG. 1B is a top view of image sensor device dies according to various aspects of the present disclosure.

FIG. 1B is a top view of image sensor device dies where the pixel-array region 101 and the peripheral region 102 are on separate dies. The separate dies are manufactured separately and stacked during the packaging process. When the pixel-array region 101 and the peripheral region 102 are manufactured on separate substrates, different processes may be applied to each region without regard for potentially undesirable effects in the other region.

The various features in the pixel-array region are more sensitive to substrate leakage current than the features in the peripheral region by several orders of magnitude. A substrate leakage current of greater than about 10E-18 Amperes can adversely affect the performance of the pixel by causing white pixel, dark current, and cross-type white pixel clusters. On the other hand, features in the peripheral region have a higher tolerance for substrate leakage. A substrate leakage current of greater than about 10E-12 Amperes can adversely affect the performance of the features in the peripheral region. Thus, manufacturing processes and designs that are suitable for the peripheral region may not be sufficient for the pixel-array region.

Figure 2:
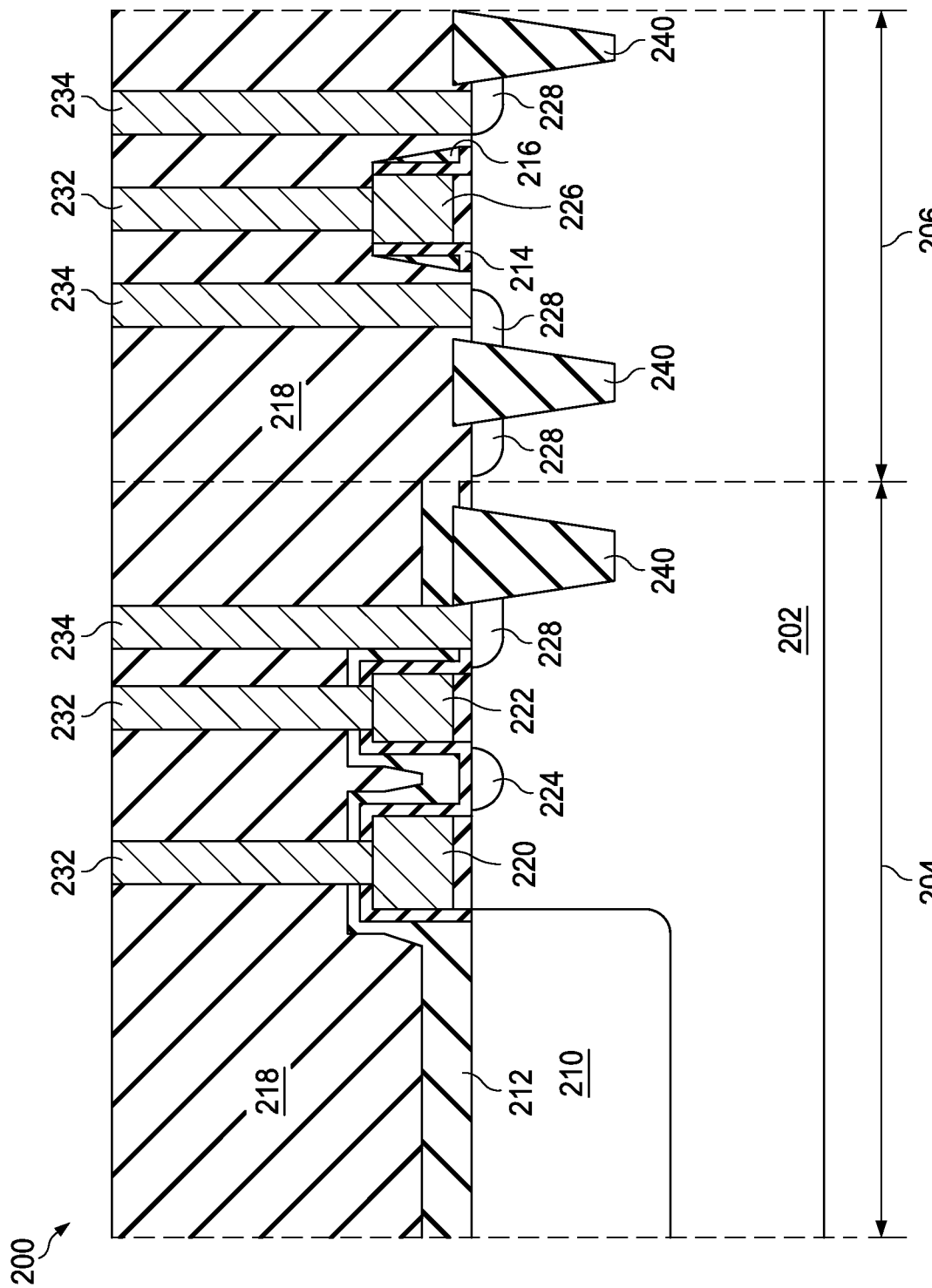
FIG. 2 is a cross sectional view of an integrated circuit device including an image sensor device sensor element according to various aspects of the present disclosure.

FIG. 2 is a diagrammatic cross-sectional view of a partially fabricated integrated circuit device 200 according to various aspects of the present disclosure. In FIG. 2, integrated circuit device 200 includes a CMOS image sensor device. The integrated circuit device 200 may be an integrated circuit (IC) chip, system on chip (SoC), or portion thereof, that includes various passive and active microelectronic components, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), other suitable components, or combinations thereof. FIG. 2 has been simplified for the sake of clarity to better understand the inventive concepts of the present disclosure. Additional features can be added in the integrated circuit device 200, and some of the features described below can be replaced or eliminated for other embodiments of the integrated circuit device 200.

In FIG. 2, the integrated circuit device 200 includes a substrate 202 having a pixel-array region 204 and a peripheral region 206. In various embodiments, the substrate 202 is a semiconductor substrate including silicon. Alternatively or additionally, the substrate 202 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. According to one or more embodiments, the substrate 202 is a semiconductor on insulator (SOI). The substrate 202 includes a doped epi layer, a gradient semiconductor layer, and/or a semiconductor layer overlying another semiconductor layer of a different type, such as a silicon layer on a silicon germanium layer. The substrate 202 may be a p-type substrate. P-type dopants with which the substrate 202 are doped with include boron, gallium, indium, other suitable p-type dopants, or combinations thereof. Because the integrated circuit device 200 includes a p-type doped substrate, doping configurations described below are consistent with a p-type doped substrate. In one or more embodiments, the substrate 202 is an n-type doped substrate, in which case, the doping configurations described below may be made consistent with an n-type doped substrate (for example, doping configurations having an opposite conductivity). The n-type doped substrate includes n-type dopants including phosphorus, arsenic, other suitable n-type dopants, or combinations thereof. According to one or more embodiments, the substrate 202 includes various p-type doped regions and/or n-type doped regions regardless of the substrate doping type. Doping may be implemented using a process such as ion implantation or diffusion in various steps and techniques.

The substrate 202 includes isolation features 240, such as local oxidation of silicon (LOCOS) and/or shallow trench isolation (STI), to separate (or isolate) various regions and/or devices formed on or within the substrate 202. For example, the isolation features 240 may isolate a sensor element 210 from adjacent sensor elements. In various embodiments, the isolation features 240 are STIs. The isolation features 240 are formed first by depositing or forming a thin liner followed by a deposition of the insulating material by any suitable process. As one example, forming an STI includes a photolithography process, etching a trench in the substrate (such as by using a dry etching, wet etching, or combinations thereof), forming a thin liner in the trench, and filling the trench (for example, by using a chemical vapor deposition process) with one or more dielectric materials. In some examples, the filled trench may have additional layers, such as a thermal oxide layer (not shown) between the insulating material and the thin liner. The STI formation additionally includes using chemical mechanical polishing (CMP) processing to etch back and planarize.

As noted above, the integrated circuit device 200 includes the sensor element 210. The sensor element 210 detects an intensity (brightness) of radiation, such as incident radiation (light), directed toward the sensor element 210. When the IC is a part of a digital camera, the incident radiation is visual light. Alternatively, the radiation is infrared (IR), ultraviolet (UV), x-ray, microwave, other suitable radiation type, or combinations thereof. The sensor element 210 may be configured to correspond with a specific light wavelength, such as a red, a green, or a blue light wavelength. In other words, the sensor element 210 may be configured to detect an intensity (brightness) of a particular light wavelength. In some embodiments, a filter allows a light of a particular wavelength to pass. In FIG. 2, the sensor element 210 is a part of a pixel included in a pixel-array, such as the pixel-array illustrated in FIGS. 1A and 1B. In FIG. 2, the sensor element 210 is a photodetector, such as a photodiode.

The pixel further includes various transistors, such as a transfer transistor associated with a transfer gate 220, a reset transistor associated with a reset gate 222, a source-follower transistor (not illustrated), a select transistor (not illustrated), other suitable transistors, or combinations thereof. The sensor element 210 and various transistors are collectively referred to as a pixel. Additional circuitry, input, and/or outputs may be provided to the sensor element 210 to provide an operation environment for the sensor element 210 and/or support communication with the sensor element 210.

The various transistor gates in the pixel circuitry, including transfer gate 220 and the reset gate 222 are disposed over the substrate 202. The transfer gate 220 interposes a source/drain region 224 of the substrate 202 and the sensor element 210, such that a channel is defined between the source/drain region 224 and the sensor element 210. The reset gate 222 interposes source/drain regions 224 of the substrate 202, such that a channel is defined between two source/drain regions 224. In some embodiments, the source/drain regions 224 are N+ source/drain diffusion regions. The source/drain regions 224 may be referred to as floating diffusion regions. The transfer gate 220 and reset gate 222 include a gate stack having a gate dielectric layer and a gate electrode. The gate dielectric layer includes a dielectric material, such as silicon oxide, a high-k dielectric material, other dielectric material, or combinations thereof. Examples of high-k dielectric material include $HfO_2$, HfSiO, HfSiON, HfTaO, HfSiO, HfZrO, zirconium oxide, aluminum oxide, hafnium dioxide-alumina ($HfO_2$—$Al_2O_3$) alloy, other high-k dielectric material, or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive material, or combinations thereof. The transfer gate 220 and the reset gate 222 are formed by a suitable process, including deposition, lithography patterning, and etching processes.

The various features of the pixel including the sensor element 210, transfer transistor, reset transistor, source-follower transistor, and select transistor are protected by a conformal protective layer 212. The conformal protective layer 212 protects the features of the pixels from plasma and implant damage during CMOS manufacturing processes in the peripheral region. The conformal protective layer 212 may be a silicon nitride, a silicon oxynitride, or a high-k dielectric. In some embodiments, the conformal protective layer 212 is a same material as the transistor gate spacer in the peripheral region and is deposited at the same time. The conformal protective layer 212 has a thickness between about 100 angstroms and 1000 angstroms. In some embodiments, the conformal protective layer 212 is greater than about 500 angstroms, for example, about 600 angstroms or about 700 angstroms.

An oxide liner 214 is disposed between the conformal protective layer 212 and the transistor gates 220 and 222. The oxide liner may also cover a portion of the substrate 202 over the source/drain regions 224. In some embodiments, the oxide liner 214 is optional.

A number of transistors are formed in the peripheral region 206. The transistors in the peripheral region 206 may include many types. For logic processing, the transistors includes at least a p-type MOS and an n-type MOS. The transistors in the peripheral region 206 include a gate stack 226 having an optional oxide liner 214 and a spacer 216. The spacer 216 may be formed of the same material as the conformal protective layer 212 in the pixel-array region 204. Source and drain regions 228 are disposed adjacent to the gate stack 226 in alignment with the gate spacer 216. In various CMOS manufacturing processes, the source and drain regions 228 are implanted using the gate spacers 216 as an implant mask to align the source and drain regions 228. In some designs, a lightly doped drain (LDD) region may be formed under the gate spacers 216. The source and drain regions 224 in the pixel-array region 204 and the source and drain regions 228 in the peripheral region 206 may have different dopant concentrations and/or profiles.

In the embodiments where the pixel-array region 101 and the peripheral region 102 are manufactured on separate substrates, a cross section of the pixel-array region 101 would not include the peripheral region 102. The spacer 216 around the transistor gates in the peripheral region 102 need not have been formed of the same material as the conformal protective layer 212 in the pixel-array region 204. According to various embodiments, the conformal protective layer 212 may be a silicon nitride, a silicon oxide, a silicon oxynitride, or a high-k dielectric. The conformal protective layer 212 may have a thickness between about 100 angstroms and 1000 angstroms. In some embodiments, the conformal protective layer 212 is less than about 500 angstroms, for example, about 400 angstroms or about 300 angstroms. Because the conformal protective layer 212 in a pixel-array region 101 manufactured on a separate substrate from the peripheral region 102 would not be subjected to the more intense processes of the peripheral region 102, in some embodiments, the thickness of the layer is reduced.

The integrated circuit device 200 further includes a multilayer interconnect (MLI) disposed over the substrate 202. The MLI is includes various conductive features, which may include vertical interconnects, such as gate contacts 232 and source/drain contacts 234. The various conductive features 232 and 234 include conductive materials, such as metal. In an example, metals including aluminum, aluminum/silicon/copper alloy, titanium, titanium nitride, tungsten, polysilicon, metal silicide, or combinations thereof, may be used. Contacts 232 and 234 may be formed by a process including physical vapor deposition (PVD), chemical vapor deposition (CVD), or combinations thereof. Other manufacturing techniques to form the various conductive features 232 and 234 may include photolithography processing and etching. Various interconnect features over the contacts 232 and 234 may be copper multilayer interconnects, which include copper, copper alloy, titanium, titanium nitride, tantalum, tantalum nitride, tungsten, polysilicon, or combinations thereof. The copper interconnects may be formed by a process including PVD, CVD, or combinations thereof.

The various conductive features 232 and 234 are disposed in an intermetal dielectric (or inter-level) dielectric (IMD/ILD) layer 218. The ILD layer 218 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable material, or combinations thereof. The ILD layer 218 may have a multilayer structure. The ILD layer 218 may be formed by a technique including spin-on coating, CVD, sputtering, or other suitable process. According to various embodiments, the ILD layer 218 and the conformal protective layer 212 are formed of different materials.

The contacts 232 and 234 in the pixel-array region 204 contact the transistor features through the conformal protective layer 212 and ILD layer 218. The contacts 232 and 234 in the peripheral region 206 contact the transistor features through the ILD layer 218. Although FIG. 2 shows the contacts 232 and 234 in the same cross section view, in various embodiments, the contacts may be located in different cross sectional planes. In other words, the cross section shown may be along non-linear cut lines. For example, contact 234 of the pixel-array region 204 may be disposed further into the workpiece. In another example, one or more of the gates 220/222 may be oriented orthogonally to each other or the sensor element 210.

The partially fabricated integrated circuit device 200 may be a part of a front sensing or backside sensing CMOS image sensor. For a backside sensing image (BSI) sensor, a completed device would also include features disposed over a back surface of the substrate 202. For example, an anti-reflective layer, a color filter, and a lens are disposed over a back surface of the substrate 202. The antireflective layer includes a dielectric material, such as silicon nitride, silicon oxynitride or high-k metal oxides. The color filter is aligned with the sensor element 210. The color filter is configured to filter through light of a predetermined wavelength. For example, the color filter filters through visible light of a red wavelength, a green wavelength, or a blue wavelength to the sensor element 210. In an example, the color filter includes a dye-based (or pigment-based) polymer for filtering out a specific frequency band (for example, a desired wavelength of light). Alternatively, the color filter includes a resin or other organic-based material having color pigments. The lens may be disposed over the color filter, and is also aligned with the sensor element 210. The lens may be in various positional arrangements with the sensor element 210 and color filter, such that the lens focuses the incident radiation on the sensor element 210. The lens may have a variety of shapes and sizes depending on an index of refraction of the material used for the lens and/or a distance between the lens and sensor element 210. Alternatively, the position of the color filter and lens may be reversed, such that the lens is disposed between the anti-reflective layer and color filter.

For a front sensing image sensor, a completed device would include features over a front surface of the substrate 202 over the MLI. Trenches may be formed in the MLI to pass incident light through a color filter and lens to the sensor element 210. Various configurations of the sensor element, color filter, antireflective layer, and lens are possible.

Figure 3A:
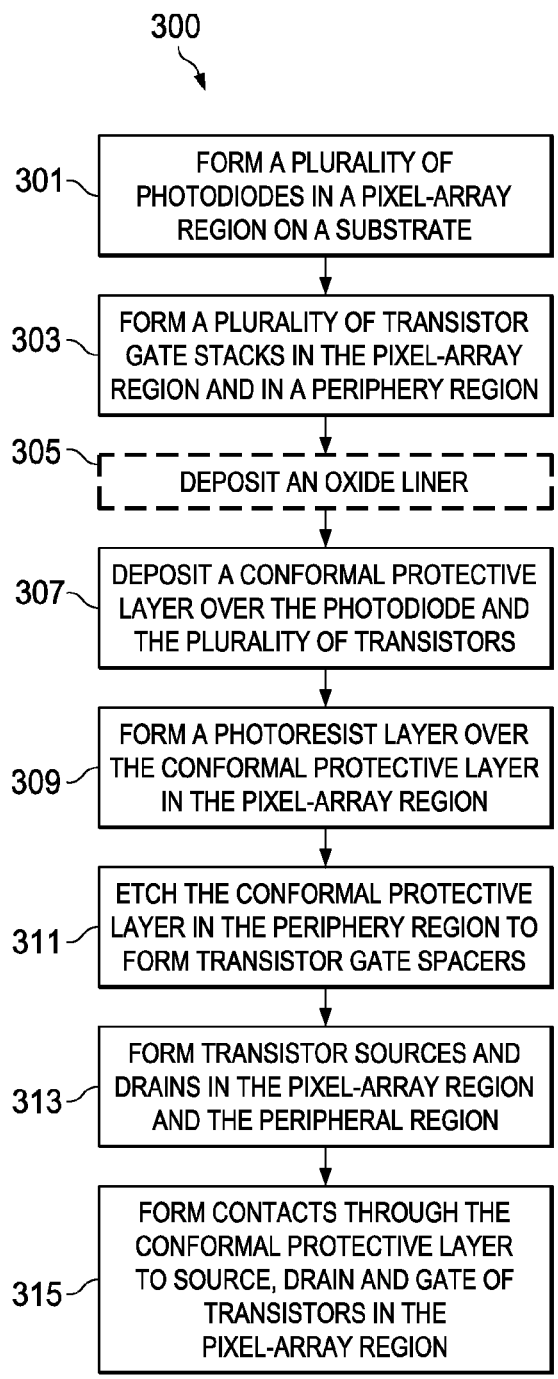
FIGS. 3A and 3B are flow charts of methods for fabricating an integrated circuit device including an image sensor device according to various aspects of the present disclosure.

FIG. 3A is a flow chart of a method for fabricating an integrated circuit (IC) device including an image sensor device according to various aspects of the present disclosure. In FIG. 3A, the method 300 begins at operation 301 where a number of photodiodes in a pixel-array region are formed on a substrate. The substrate is a semiconductor substrate including silicon and may include a doped epi layer, a gradient semiconductor layer, and/or a semiconductor layer overlying another semiconductor layer of a different type, such as a silicon layer on a silicon germanium layer. In some embodiments, the substrate is a p-type substrate doped with boron, gallium, indium, other suitable p-type dopants, or combinations thereof. The substrate is separated into grids of die sections. Each die section includes at least one pixel-array region and a peripheral region. A photodiode is used herein as an example of a sensor element. Other types of photo sensor may be used. A photodiode is a doped region having n-type and/or p-type dopants formed in the substrate using a method such as diffusion and/or ion implantation.

At operation 303, a number of transistor gate stacks are formed in the pixel-array region and the peripheral region. The transistor gate stacks may be different between the pixel-array region and the peripheral region, depending on the design of the (IC) device. For example, the gate dielectric may have different thicknesses and the width, hence the channel length, may be different between different transistors. The transistor gates are formed using CMOS manufacturing processes such as CVD and PVD, lithography, and etching.

At optional operation 305, an oxide liner is deposited. The oxide liner covers the surface of the substrate, including a top and sidewalls of the gate stack and the photodiode. If used, the oxide liner may serve to better adhere a subsequently deposited layer to the substrate and the gate stack.

At operation 307, a protective layer is formed on the substrate. According to some embodiments, the protective layer is a silicon nitride or nitride dielectric. The nitride material may be a silicon nitride or other nitrogen-rich dielectric film, such as tantalum nitride, titanium nitride, hafnium nitride, aluminum nitride, magnesium nitride, or other metal nitrides that can be formed using existing semiconductor deposition technologies. The nitride material may be deposited using a CVD technique or a PVD technique. The CVD process may be a PECVD including ICPECVD, an LPCVD, or an ALD with or without plasma. The protective layer is a conformal protect layer deposited over the substrate, including over the sensing element, the transistor gates, and isolation features. The conformal protective layer may be 1000 angstrom or less, 700 angstroms or less, and sufficiently thick, for example, over 100 angstroms, to protect the underlying features in the pixel-array region from plasma damage.

According to one or more embodiments, the protective layer is a high-k metal oxide. The high-k metal oxide may be an aluminum oxide, magnesium oxide, calcium oxide, hafnium oxide, zirconium oxide, yttrium oxide, tantalum oxide, strontium oxide, titanium oxide, lanthanum oxide, barium oxide, or other metal oxides that can form a high-k film using existing semiconductor deposition technologies. The high-k metal oxide may be deposited using a chemical vapor deposition (CVD) technique or a physical vapor deposition (PVD) technique. The CVD process may be a plasma enhanced chemical vapor deposition (PECVD) including ICPECVD, a low pressure chemical vapor deposition (LPCVD), or an atomic layer deposition (ALD) with or without plasma.

Figure 4:
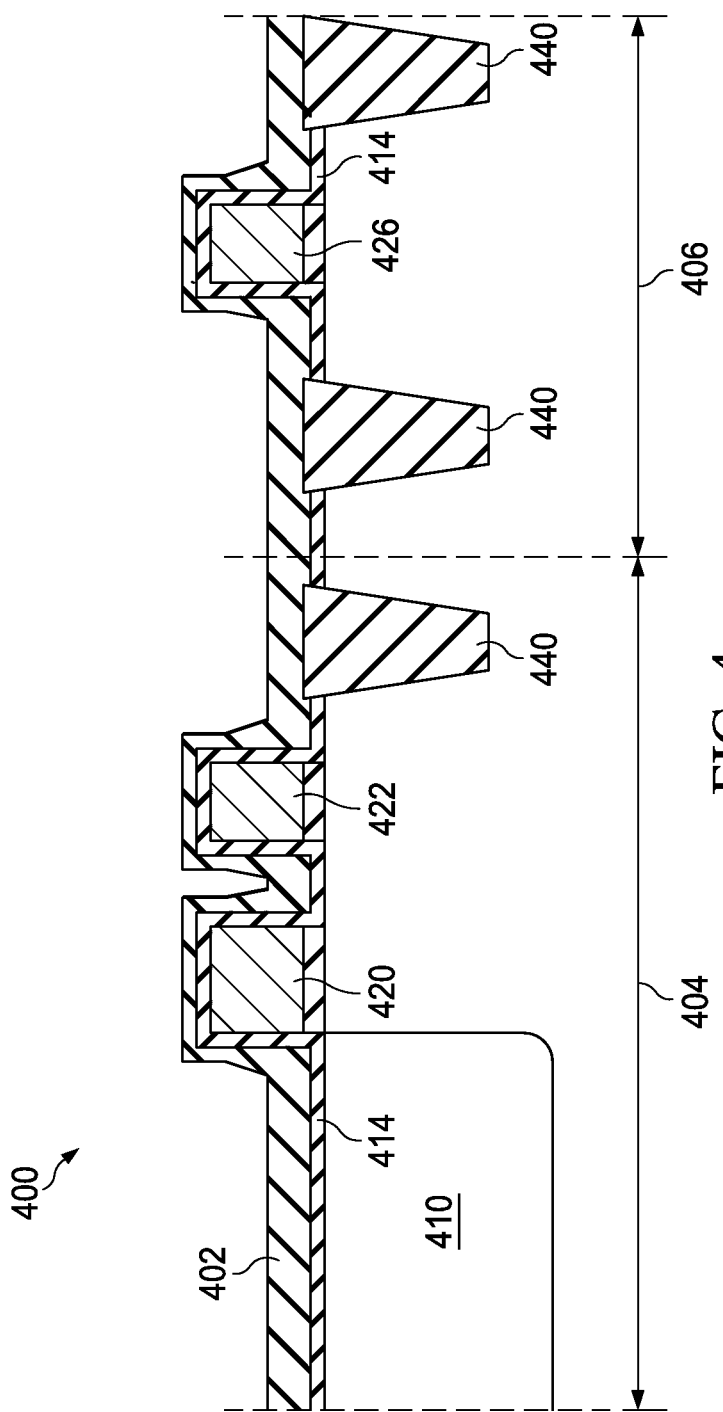
FIGS. 4-6, 7A-7C, and 8-9 are cross sectional view of a partially fabricated image sensor integrated circuit device according to various embodiments of the present disclosure.

FIG. 4 is a cross-sectional diagram of a partially fabricated IC device 400 having a pixel-array region 404 and a peripheral region 406. A conformal protective layer 402 is deposited and disposed over sensing element 410, transistor gates 420, 422, and 426, isolation features 440. An oxide liner 414 may be disposed between the various features and the conformal protective layer 402.

Figure 5:
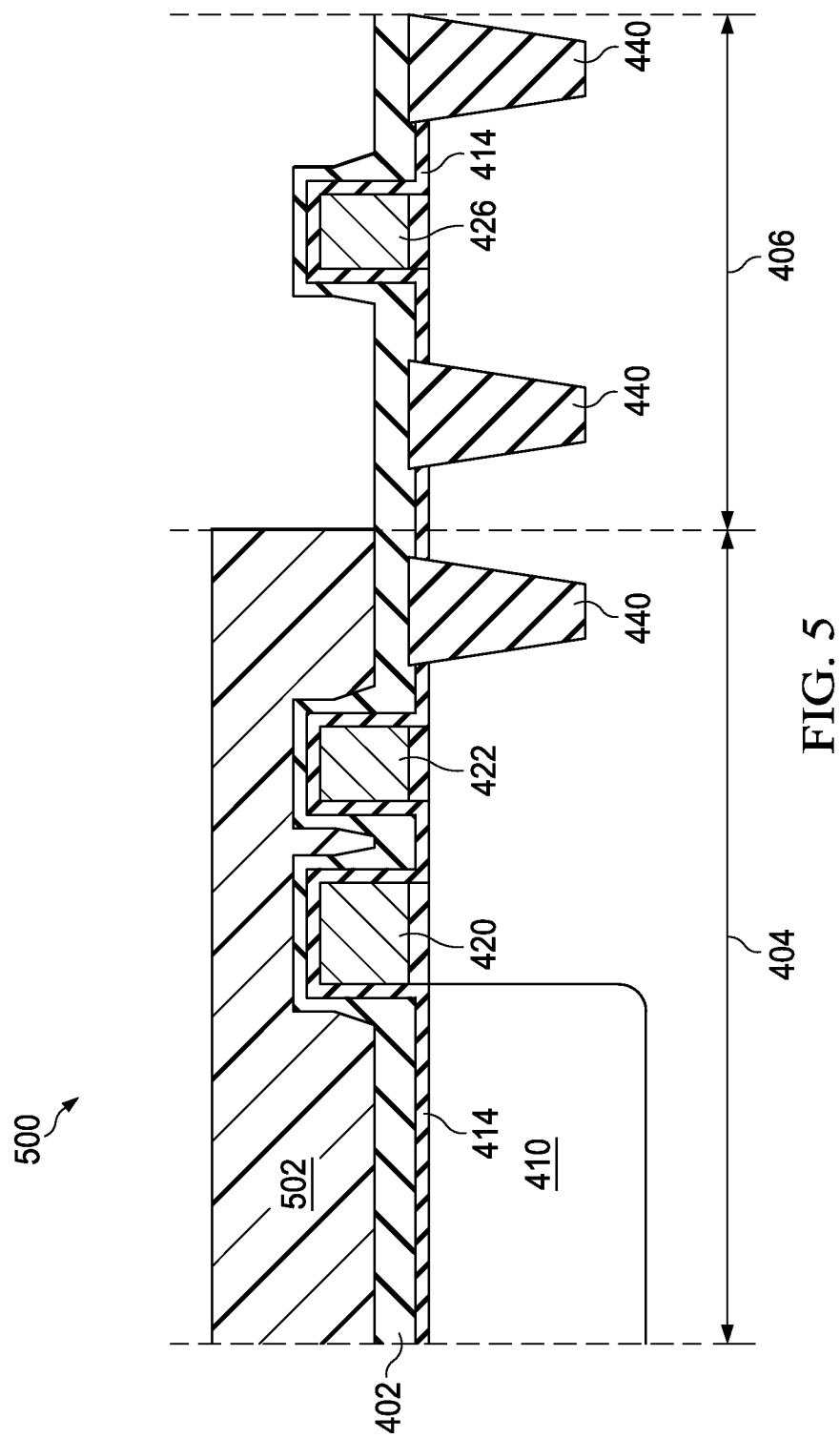

Referring to FIG. 3A, in operation 309, a photoresist layer is formed over the conformal protective layer in the pixel-array region. The photoresist layer is formed using conventional photolithography processes. As shown in FIG. 5, the photoresist 502 covers the various features in the pixel-array region 404.

Figure 6:
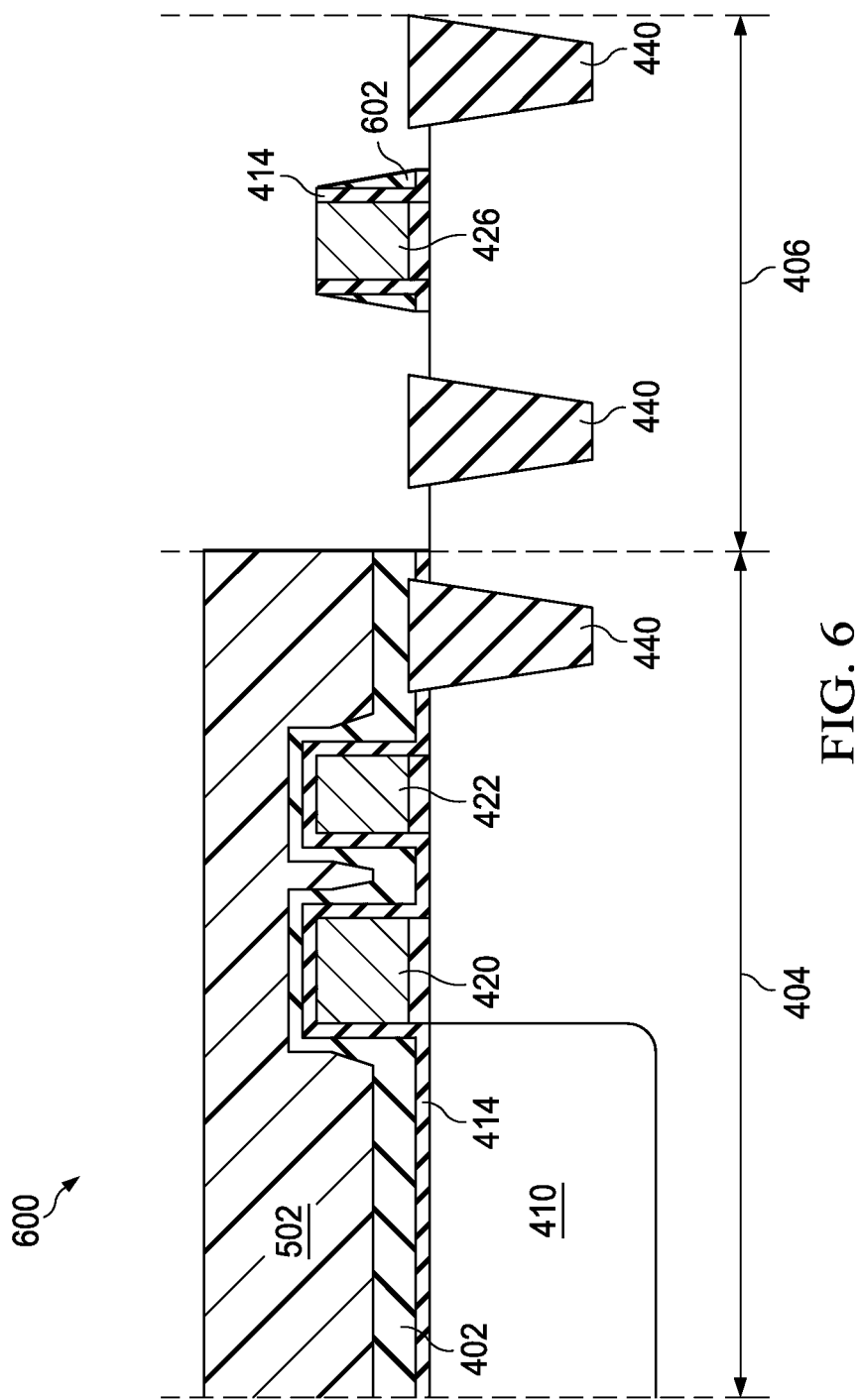

Referring to FIG. 3A, in operation 311, the conformal protective layer in the peripheral region is etched to form transistor gate spacers. The spacer formation process is performed using anisotropic dry etch processes and may also remove oxide liner material in the field region between transistor gates. The anisotropic dry etch process uses fluorine-containing or chlorine-containing plasma ions to remove exposed conformal protective layer over horizontal features. Thus, the conformal protective layer over the transistor gate, over the isolation features, and over field regions of the substrate between various features is removed while a portion of the conformal protective layer around the transistor gate sidewalls remains. FIG. 6 is a cross-sectional diagram of a partially fabricated IC device 600 after the spacer etch. The conformal protective layer 402 under the photoresist in the pixel-array region 404 is protected from the etch process while only the spacer portions 602 around the transistor gate 426 in the peripheral region 406 remains. While not intending to be bound by this theory, it is believed that the dry etch process to form spacers would cause plasma damage that contribute to undesirable amount of leakage current if performed in the pixel-array region 404. Because the pixel-array region 404 is protected by the photoresist 502 and conformal protective layer 402, the plasma damage is prevented or reduced.

In various embodiments, the transistor gate spacer in the peripheral region is formed of the same material as the conformal protective layer; however, the transistor gate spacer may be formed of different materials in a separate deposition process. For example, the conformal protective layer may be deposited first while the peripheral region is covered by a photoresist. In another example, two layers of material may be used in the conformal protective layer, for example, a first layer of silicon nitride and a second layer of a high-k dielectric. The spacer etch would remove the high-k dielectric and portions of the silicon nitride to form silicon nitride spacers while the conformal protective layer under the photoresist would have two layers.

Figure 3B:
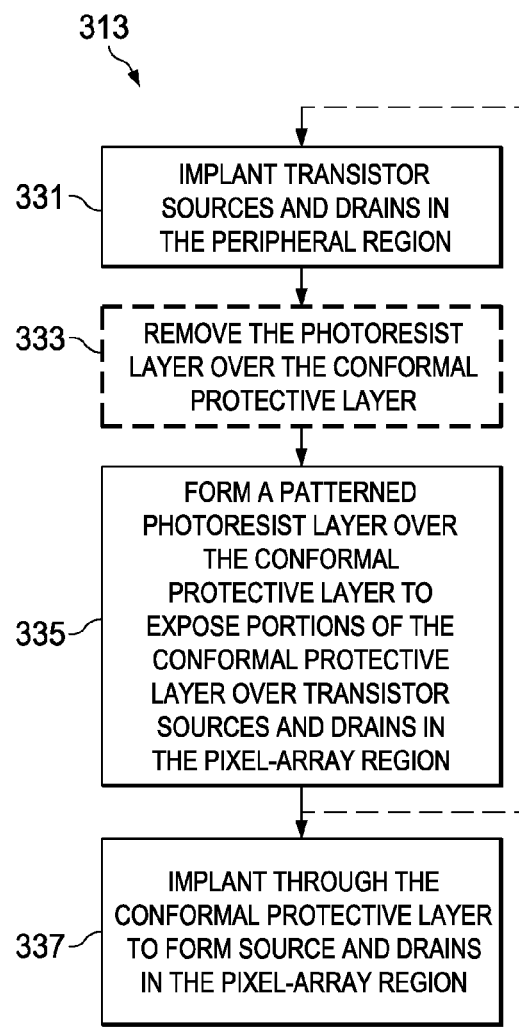

Referring to FIG. 3, in operation 313, transistor sources and drains are formed in the pixel-array region and the peripheral region. The source and drain of the various transistors in the pixel-array region and the peripheral region are formed by implant processes in a number of different ways. FIG. 3B is a process flow diagram showing different ways of operation 313 to form the source and drain for transistors in different regions. According to various embodiments, the source and drain of the transistors in the pixel-array region are implanted through the conformal protective layer. The implantation of the source and drain of transistors in the pixel-array region and the peripheral region may be performed at the same time, at different times, or in multiple steps where some are concurrent and some are not.

Figure 7A:
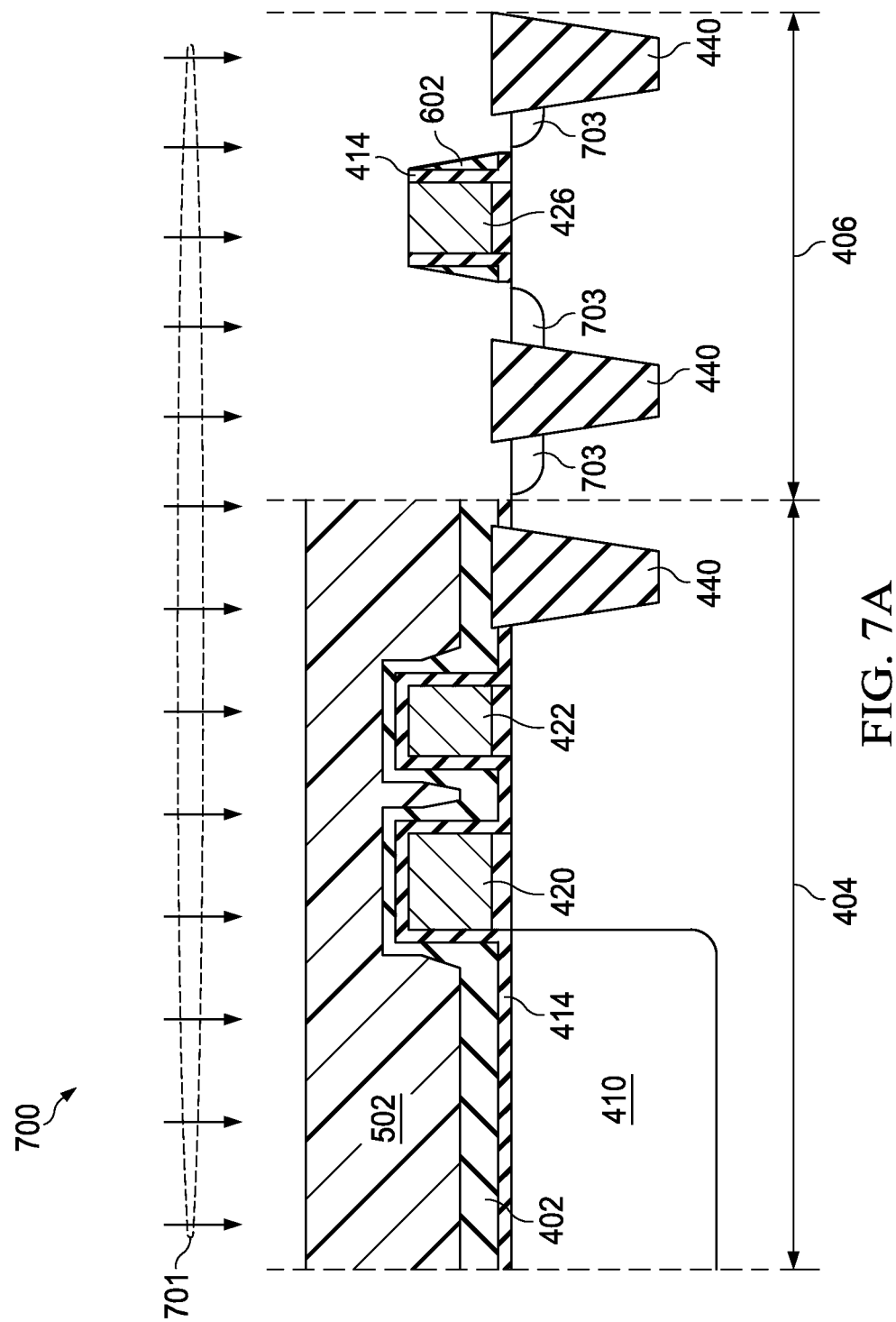

In some embodiments, the transistor sources and drains in the peripheral region are implanted first, as shown in operation 331 of FIG. 3B. FIG. 7A shows the implantation 701 to the partially fabricated IC device 700 to the peripheral region 406 while the pixel-array region 404 is covered by photoresist 502. The implantation forms source and drain regions 703 that are aligned with the transistor gate spacer 602 and the isolation regions 440. The implantation of source and drain 703 may be performed at a first power and first dose to form a first dopant profile. The implantation does not affect the transistors in the pixel-array region 404 because the photoresist absorbs the dopants.

The transistor sources and drains in the pixel-array region are then implanted in a second implant operation separate from the first implant operation. The photoresist layer over the pixel-array region may be removed in operation 333 of FIG. 3B and a new patterned photoresist formed over the peripheral region 406 and the conformal protective layer with openings over the sources and drains in operation 335.

Figure 7B:
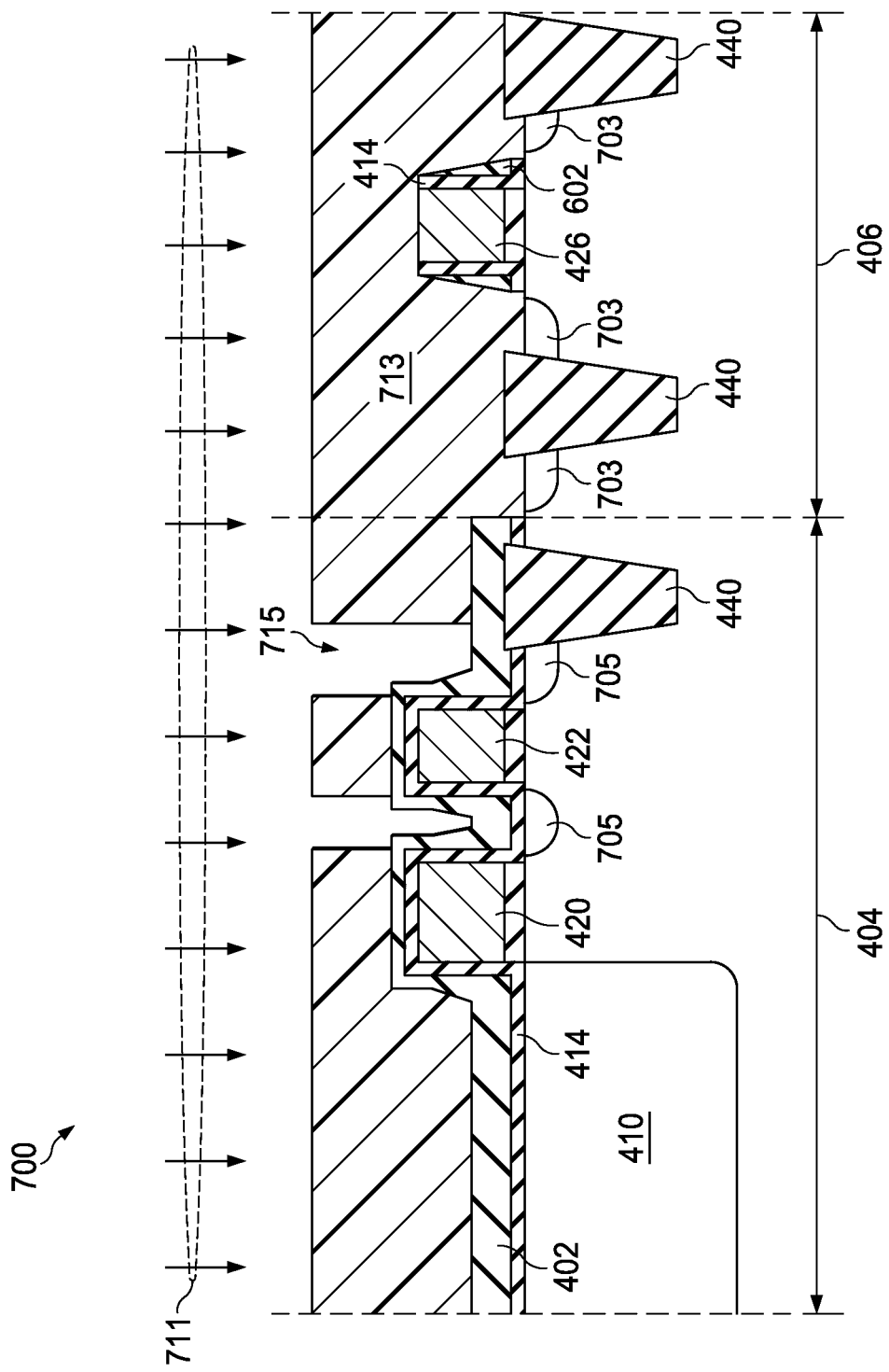

In operation 337, a second implantation for the sources and drains in the pixel-array region is performed. FIG. 7B shows the implantation 711 to the partially fabricated IC device 700 to the pixel-array region 404 while the peripheral region 406 is covered by photoresist 713. The dopants are implanted through the conformal protective layer 402 through openings 715 in the photoresist 713 to form sources/drains 705. The implantation of source and drain 705 may be performed at a second power and second dose to form a second dopant profile. The implantation does not affect the transistors in the peripheral region 406 because the photoresist 713 absorbs the dopants. The second implantation may be performed at a higher energy and/or a higher dosage because a portion of the conformal protective layer covers target areas for the sources/drains. As result, some dopants would remain in the conformal protective layer portions overlying the sources and drains in the pixel-array region. The implantation process parameters may be tuned such that the result dopant profiles in sources and drains 703 and 705 are the same.

Figure 7C:
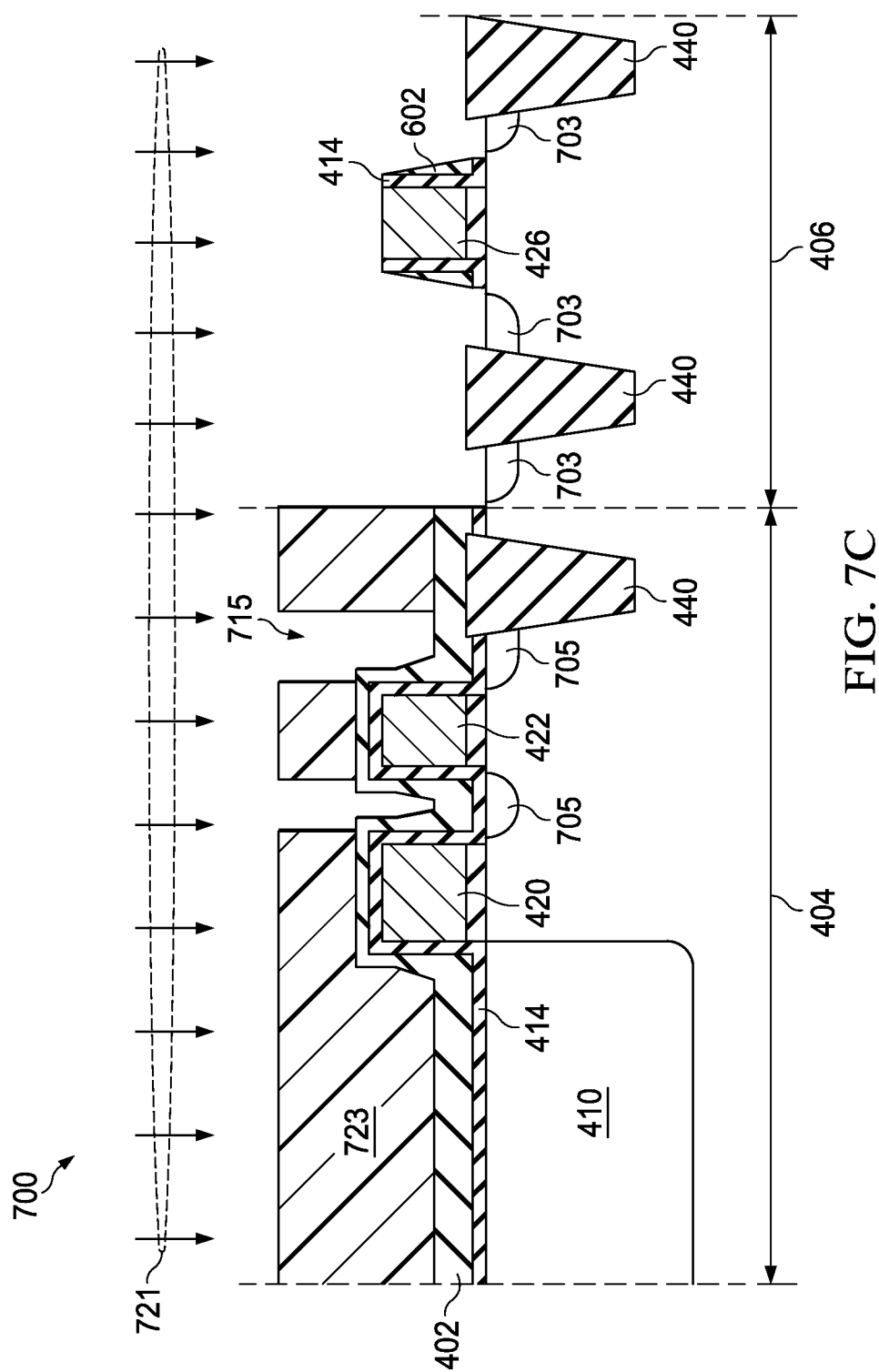

In some embodiments, the implantation is performed concurrently. The optional flow lines in FIG. 3B would include patterning a photoresist in operation 335 and then proceed to concurrent implantation of operations 331 and 337. The photoresist 502 of FIGS. 5 and 6 may be removed first and a new patterned photoresist formed; or, the photoresist 502 may be etched to form openings over the conformal protective layer to the target areas of sources and drains. FIG. 7C shows the implantation 721 to the partially fabricated IC device 700 to both the pixel-array region 404 and peripheral region 406. The dopants of sources and drains 705 are implanted through the conformal protective layer 402 through openings 715 in the photoresist 723. At same time, sources and drains 703 are formed in the peripheral region 406 in a self-aligned operation. When implanted concurrently, the dopant profiles for sources and drains 705 and 703 are necessarily different because the implanted depths are different. In the pixel-array region 404, the dopants goes through a portion of the conformal protective layer while in the peripheral region 406, the dopants does not. Because the transistors in the pixel-array region and the transistors in the peripheral regions perform different functions, they may be designed differently with different electrical properties so that a reduced dopant concentration in the pixel-array region is used.

In still some embodiments, the sources and drains 705 in the pixel-array region 404 may be implanted twice, once concurrently with the transistors in the peripheral region 406 and once by themselves to achieve a desired dopant profile. The photoresist from operation 309 may be patterned and etched for the first implant. The photoresist is then removed and new photoresist formed with a pattern for the second implant.

Two types of transistors, n-type MOS and p-type MOS, are used in the peripheral region. Only one of the two types of transistors can be implanted concurrently with the transistors in the pixel-array region because only one type of transistor is used in the pixel-array region. The transistors in the pixel-array region may be n-type transistors and implanted together with n-type transistors in the peripheral region. When p-type transistors are implanted, the n-type transistors are protected by a photoresist and vice versa.

Figure 8:
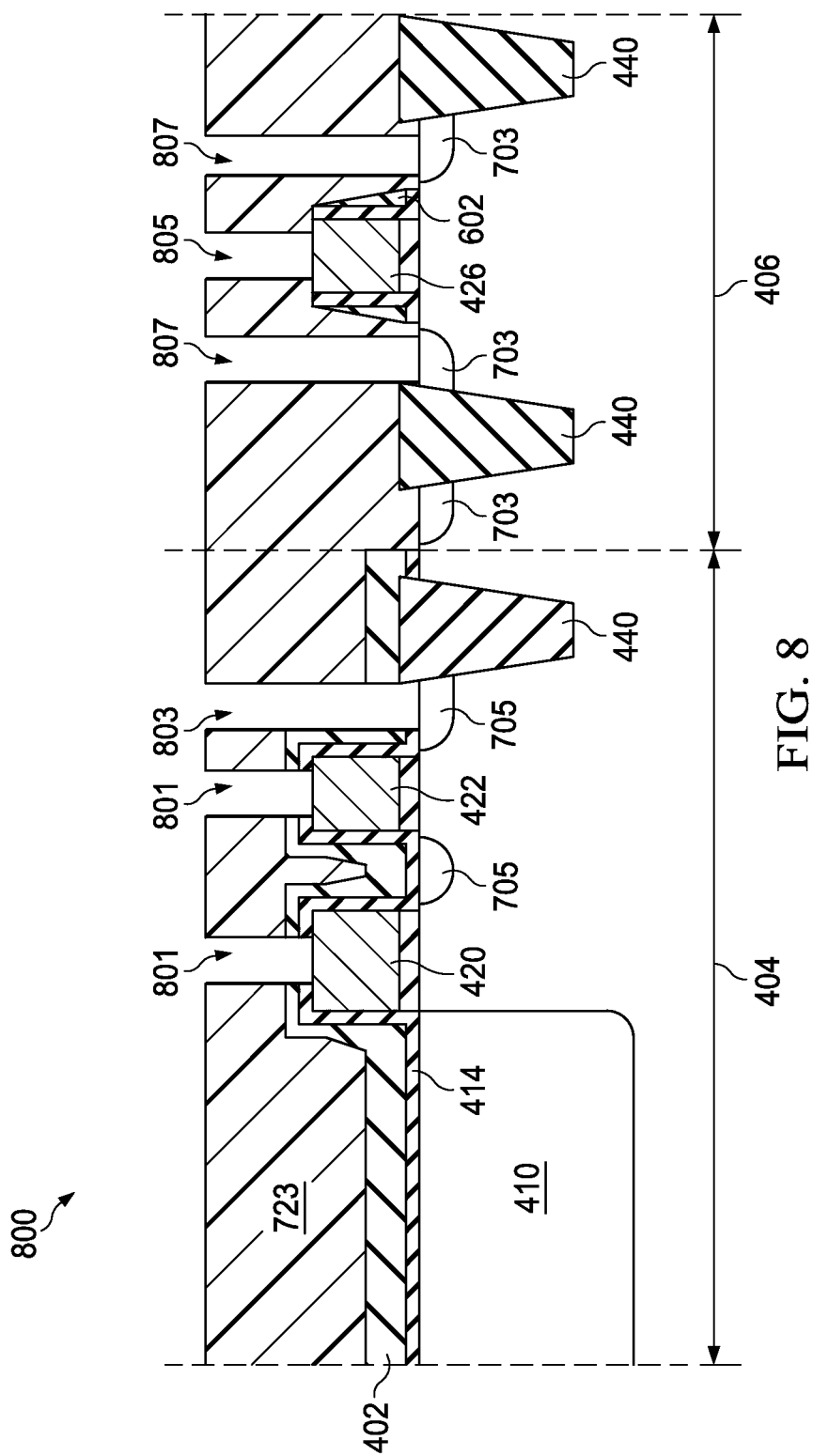
Figure 9:
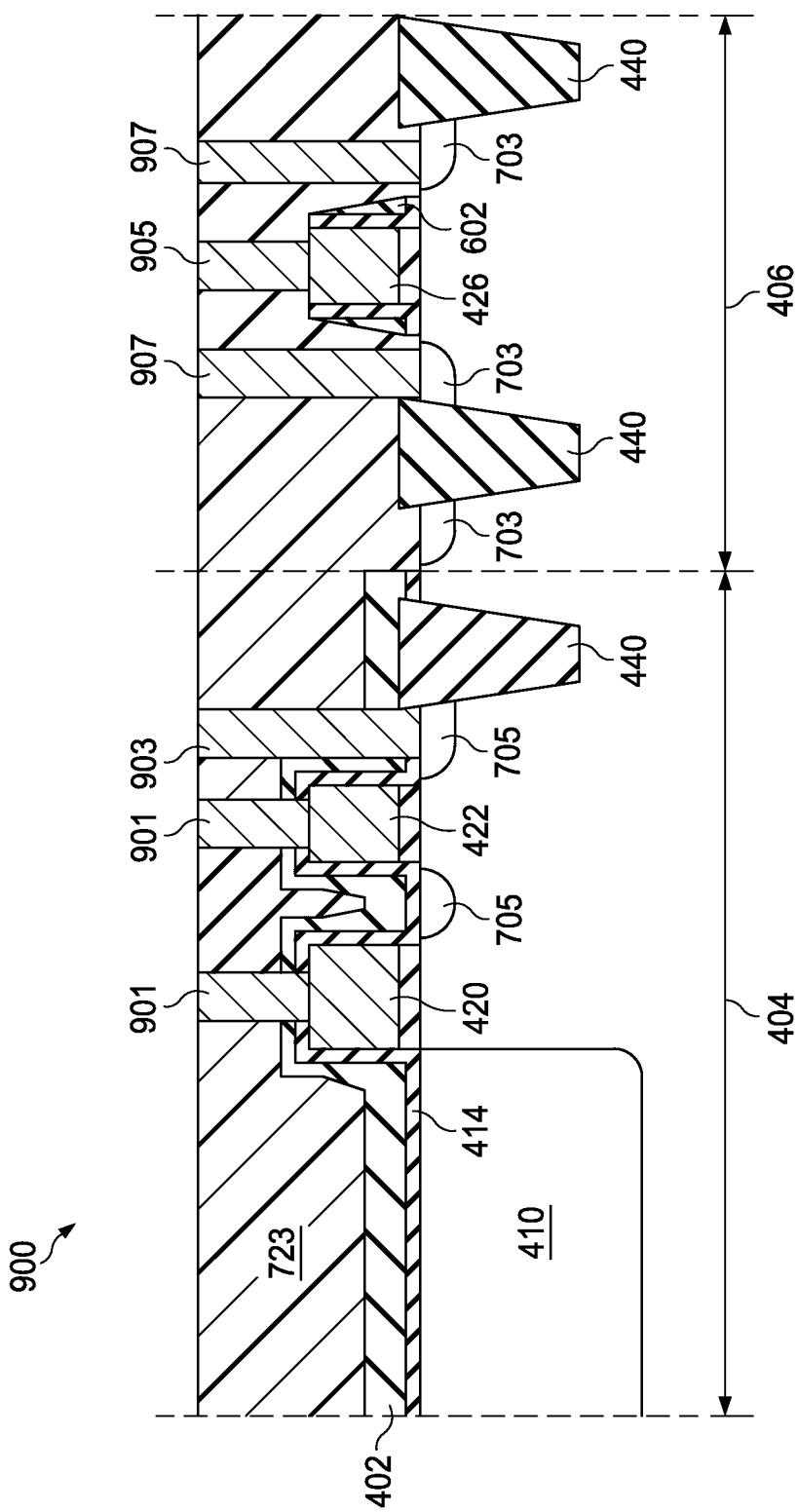

Referring to FIG. 3A, in operation 315 contacts are formed through the conformal protective layer to source, drain, and gate of transistors in the pixel-array region. According to various embodiments, contact vias are etched in the conformal protective layer to source, drain, and gate of transistors in the pixel-array region, contact vias are etched in the IMD to source, drain, and gate of transistors in the peripheral region, and contact metal is deposited in the contact vias in the pixel-array region and the peripheral region. An IMD layer is deposited over the substrate. The contact vias in the pixel-array region and the peripheral region may be etched separately or at the same time. In some embodiments, they are etched at the same time. The etch process is selected such that the etch selectivity between the IMD and the conformal protective layer is similar to avoid excessive over etching. In some embodiments, more than one etch process may be used. For example, a first etch process may be used to reach the conformal protective layer in the pixel-array region, and then a second etch process that has a higher etch rate for the conformal protective layer is used to complete the etch. The contact vias penetrate through the IMD, conformal protective layer, and any remaining oxide liner to contact the source, drain, and gate regions. FIG. 8 is a cross-sectional diagram of a partially fabricated IC device 800 having various contact vias. In the pixel-array region 404, contact vias 801 expose transistor gates and contact via 803 expose source or drain of the transistor associated with gate 422. In some embodiments, a contact via is not needed for some source/drain because it is connected to an adjacent transistor. An example is the source/drain 705 between transistor gates 420 and 422. During device operation, it acts as a source of one transistor and a drain for another. In the peripheral region 406, contact via 805 exposes the transistor gate 426 and contact vias 807 exposes source/drain 703. FIG. 9 is a cross-sectional diagram of a partially fabricated IC device 900 having contacts 901, 903, 905, and 907. The contacts contain a metal deposited using CVD, PVD, or a plating process. In some embodiments, the contacts include one or more metal deposited using a CVD process. The substrate is planarized after the contact metal deposition to form the cross section of FIG. 9, which is the same cross section as FIG. 2.

The present disclosure provides for many different embodiments of methods and device. For example, a semiconductor image sensor device includes a number of pixels and isolation features between each of the number of pixels in a pixel-array region, each of the number of pixels having a photodiode and a number of transistors, a conformal protective layer over the photodiode and the number of transistors in the number of pixels, and a number of contacts through the conformal protective layer contacting features in the number of transistors.

In another aspect, the present disclosure pertains to a semiconductor image sensor device including a number of pixels and isolation features between each of the number of pixels in a pixel-array region, each of the number of pixels having a photodiode and a number of transistors, a conformal protective layer over the photodiode and the number of transistors in the plurality of pixels, and a number of transistors in a peripheral region. The conformal protective layer does not cover the number of transistors in the peripheral region.

In yet another aspect, the present disclosure pertains to a method of forming a semiconductor image sensor device having a conformal protective layer in the pixel-array region. The method includes forming a number of photodiodes in a pixel-array region on a substrate, forming a number of transistor gate stacks in the pixel-array region and in a peripheral region, depositing a conformal protective layer over the photodiode and the number of transistors, forming a photoresist layer over the conformal protective layer in the pixel-array region, etching the conformal protective layer in the peripheral region to form transistor gate spacers, removing the photoresist layer over the conformal protective layer, forming a patterned photoresist layer over the conformal protective layer to expose portions of the conformal protective layer over transistor sources, drains and gates of in the pixel-array region, and forming transistor sources and drains in the pixel-array region by implanting through the conformal protective layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a plurality of photodiodes in a pixel-array region on a substrate;
    forming a plurality of transistor gate stacks in the pixel-array region and in a peripheral region;
    depositing a conformal protective layer over the photodiode and the plurality of transistor gate stacks;
    forming a photoresist layer over the conformal protective layer in the pixel-array region;
    etching the conformal protective layer in the peripheral region to form transistor gate spacers;
    removing the photoresist layer over the conformal protective layer;
    forming a patterned photoresist layer over the conformal protective layer to expose portions of the conformal protective layer over transistor source regions and drains regions in the pixel-array region; and
    forming transistor sources and drains in the pixel-array region by implanting through the conformal protective layer.

2. The method of claim 1, further comprising forming transistor sources and drains in the peripheral region.

3. The method of claim 2, wherein the transistor sources and drains in the peripheral region and the pixel-array region are formed simultaneously.

4. The method of claim 1, wherein the patterned photoresist layer over the conformal protective layer also covers the plurality of transistor gate stacks in the peripheral region.

5. The method of claim 1, wherein the step of forming transistor sources and drains in the pixel-array region by implanting comprises two implanting operations at different doses and energy.

6. The method of claim 1, further comprising depositing an oxide liner before depositing the conformal protective layer.

7. The method of claim 1, further comprising forming contacts through the conformal protective layer to respective sources, drains and gates of transistors in the pixel-array region.

8. The method of claim 7, where in the forming contacts comprises:
    etching contact vias in the conformal protective layer to respective sources, drains and gates of transistors in the pixel-array region;

etching contact vias in an intermetal dielectric (IMD) to source, drain and gate of transistors in the peripheral region; and depositing contact metal in the contact vias in the pixel-array region and peripheral region.

9. The method of claim 1, wherein the conformal protective layer is selected from the group consisting essentially of oxygen-rich silicon oxide, high-k metal oxide, or silicon nitride.

10. The method of claim 1, wherein a thickness of the conformal protective layer is greater than a width of the transistor gate spacers in the peripheral region.

11. A method, comprising:
forming isolation regions between respective pixel-array regions of a substrate;
forming a plurality of pixels in the pixel-array regions, each of the plurality of pixels having a photodiode and a plurality of transistors;
depositing a conformal protective layer over the photodiode and the plurality of transistors in the plurality of pixels;
implanting respective source regions for the plurality of transistors through the conformal protective layer;
patterning the conformal protective layer to include a plurality of contact holes; and
forming in respective contact holes, conductive elements contacting respective features in the plurality of transistors.

12. The method of claim 11, wherein depositing a conformal protective layer comprises depositing a silicon nitride layer.

13. The method of claim 11, wherein depositing a conformal protective layer comprises depositing the conformal protective layer to a thickness of 700 angstroms or less.

14. The method of claim 11, further comprising depositing a conformal oxide layer between the conformal protective layer and the photodiode and the plurality of transistors.

15. The method of claim 11, further comprising doping at least a portion of the conformal protective layer.

16. A method, comprising:
forming isolation regions between respective pixel-array regions of a substrate;
forming a plurality of pixels in the pixel-array regions, each of the plurality of pixels having a photodiode and a plurality of transistors;
forming a plurality of transistors in a peripheral region;
depositing a conformal protective layer over the photodiode and the plurality of transistors in the pixel-array regions and over the plurality of transistors in the peripheral region; and
etching the conformal protective layer over the plurality of transistors in the peripheral region to form gate spacers while leaving the conformal protective layer intact over the photodiode and the plurality of transistors in the plurality of pixels;
forming a patterned mask over the conformal protective layer in the pixel-array regions, the patterned mask exposing portions of the conformal protective layer; and
implanting source regions into the substrate in the pixel-array region through the exposed portions of the conformal protective layer.

17. The method of claim 16, wherein etching the conformal protective layer comprises an anisotropic dry etch process.

18. The method of claim 16, further comprising doping respective source/drains of the plurality of transistors in the plurality of pixels to a first concentration and doping respective source/drains of the plurality of transistors in the peripheral region to a second concentration different from the first concentration.

19. The method of claim 16, further comprising depositing an oxide liner layer before depositing the conformal protective layer.

20. The method of claim 16, wherein depositing the conformal protective layer comprises depositing a high-k dielectric layer.

* * * * *